United States Patent
Takagi

(10) Patent No.: US 8,097,906 B2
(45) Date of Patent: Jan. 17, 2012

(54) SEMICONDUCTOR DEVICE HAVING FINGER ELECTRODES

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 520 days.

(21) Appl. No.: 12/294,620

(22) PCT Filed: Oct. 23, 2007

(86) PCT No.: PCT/JP2007/070640
§ 371 (c)(1),
(2), (4) Date: Sep. 26, 2008

(87) PCT Pub. No.: WO2008/053748
PCT Pub. Date: May 8, 2008

(65) Prior Publication Data
US 2010/0237437 A1    Sep. 23, 2010

(30) Foreign Application Priority Data
Nov. 2, 2006   (JP) ................. 2006-298820

(51) Int. Cl.
H01L 23/48 (2006.01)
H01L 29/78 (2006.01)
H01L 29/80 (2006.01)

(52) U.S. Cl. ........ 257/287; 257/275; 257/276; 257/277; 257/401

(58) Field of Classification Search .......... 257/401, 257/275–277, 287
See application file for complete search history.

(56) References Cited

U.S. PATENT DOCUMENTS
5,883,407 A * 3/1999 Kunii et al. .............. 257/275
2005/0093033 A1 * 5/2005 Kinoshita et al. ............ 257/288

FOREIGN PATENT DOCUMENTS
DE    195 22 364 C1    7/1996
JP    1 96965    4/1989
(Continued)

OTHER PUBLICATIONS

U.S. Appl. No. 12/786,942, filed May 25, 2010, Takagi. Office Action issued Apr. 26, 2011 in Taiwan Application No. 096141191 (With English Translation).

(Continued)

*Primary Examiner* — Ha Tran T Nguyen
*Assistant Examiner* — Raj R Gupta
(74) *Attorney, Agent, or Firm* — Oblon, Spivak, McClelland, Maier & Neustadt, L.L.P.

(57) ABSTRACT

A semiconductor device which has low input inductance is provided.

It includes: source finger electrodes (3) disposed by predetermined direction on the main substrate 1; drain finger electrodes (4) placed and disposed a predetermined interval to each of the source finger electrodes (3); gate finger electrodes (2) disposed between the source finger electrodes (3) and the drain finger electrodes (4), respectively; source pads (6) placed and disposed a predetermined interval at one side of finger electrode array; drain pads (7) disposed between the source pads (6); gate pads (5) which placed and disposed a predetermined interval at the another side of the finger electrode array; source electrode wirings (source bus-line LS, source bridge-line NS and source bridge-line M) for connecting the source finger electrodes (3) to the source pads (6); drain electrode wirings (drain bus-line LD, the drain bridge-line ND, and the drain bridge-line P) for connecting the drain finger electrodes (4) to the drain pads (7); and gate bus-lines for connecting the gate finger electrodes (2) to the gate pads (5).

5 Claims, 4 Drawing Sheets

FOREIGN PATENT DOCUMENTS

| | | |
|---|---|---|
| JP | 3-150851 | 6/1991 |
| JP | 6 209015 | 7/1994 |
| JP | 7 226489 | 8/1995 |
| JP | 07226489 A * | 8/1995 |
| JP | 10 233404 | 9/1998 |
| JP | 11 87367 | 3/1999 |
| JP | 11 283996 | 10/1999 |
| JP | 2002 319593 | 10/2002 |

OTHER PUBLICATIONS

European Search Report issued Nov. 2, 2011 for EP 07 83 0374.
Saptharishi Sriram et al. "Reduction of Common-Source Inductance in FET/HEMT Structures Utilizing Wave-Propagation Effects" IEEE Transactions on Microwave Theory and Techniques, vol. 48, No. 3, Mar. 2000, pp. 406-411.

* cited by examiner (a)

(b)

(a)

(b)

SEMICONDUCTOR DEVICE HAVING FINGER ELECTRODES

TECHNICAL FIELD

The present invention relates to a semiconductor device, in particular to a semiconductor device which has a characteristic in arrangement of a plurality of electrodes.

BACKGROUND ART

As a semiconductor device including a multi-finger type FET (Field Effect Transistor) of which a source electrode, a gate electrode and a drain electrode are formed of a plurality of fingers respectively, a semiconductor device described in Patent Document 1 is well known.

Patent Document 1: JP, 11-87367, A.

FIG. 5 is a figure for explaining an electrode structure of a semiconductor device of the Patent Document 1.

That is, in this semiconductor device, as shown in FIG. 5(a), a gate finger electrode 2, a source finger electrode 3, and a drain finger electrode 4 are disposed so that they may engage mutually in the central part mostly on a rectangular substrate 53. That is, it is disposed so that a relation that the gate finger electrode 2 is placed between the source finger electrode 3 and the drain finger electrode 4 may be repeated. A gate pad 50 to which the gate finger electrode 2 is connected, and a source pad 51 to which the source finger electrode 3 is connected are disposed by turns along with one side (the lower side of the figure) of the substrate 53. And, a drain pad 52 to which the drain finger electrode 4 is connected is disposed along with a side (surface of the figure) to which the substrate 53 faces.

As shown in FIG. 5(b), as for the substrate 53, a metal ground plate 54 as a ground is formed on the backside. An input side substrate 55 and an output side substrate 56 with which an input side matching circuit and an output side matching circuit (not shown) are formed on the surface, respectively are provided in an input side and an output side of the substrate 53. The ground plate 54 is formed so that the part may be exposed on the substrate surface between the input side substrate 55 and the substrate 53.

The source pad 51 is bonded to an exposed part 58 of the ground plate 54 with a wire 57, and, accordingly the source electrode is grounded. Moreover, the gate pad 50 is connected to the matching circuit for the input on the input side substrate 55 through a wire 59, and the drain pad 52 is connected to the matching circuit for the output on the output side substrate 56 through wires 60 and 61.

On the other hand, in such multi-finger type FET, a device described in Patent Document 2 is conventionally known as a semiconductor device of structure where the source pad is grounded through a via hole (VIA).

Patent documents 2: JP, 11-283996, A.

In the conventional semiconductor device shown in FIG. 5 mentioned above, since the wire 59 which connects a matching circuit and the gate pad 50 for the input on the input side substrate 55 is connected ranging over the exposed part 58 of the ground plate, only worth equivalent to width of the exposed part 58 requires longer wire length. As a result, the input inductance of the wire becomes longer, and therefore there is a fault of reducing the resonance frequency. It becomes impossible for this reason, to compose the matching circuit for operation on high frequency.

Furthermore, a part with which the gate bus-line and the finger part of the source electrode overlap, i.e., parasitic capacitance by an overlay 62, has great influence on gain of the FET.

FIG. 6 is a figure for explaining an electrode structure of the semiconductor device of Patent Document 2. As this semiconductor device is shown in FIG. 6, arrangement and structure of a gate pad 50 and a source pad 51 differ from the semiconductor device shown in FIG. 5. That is, in the semiconductor device shown in FIG. 6, the gate pad 50 and the source pad 51 are disposed by two rows along the lower side of a substrate 53. The source pad 51 is connected to a metal ground plate (not shown) provided in the backside of the substrate 53 through a via hole 63. The gate pad 50 is shifted along the lower side of the substrate 53, and is placed so as to be placed for the source pad 51 on a position between them. The gate pad 50 is connected to each gate finger electrode 2 through a gate drawing line 65, which passes through between the adjoining source pads 51, respectively. In addition, in FIG. 6, the same reference numeral is attached to a part corresponding to a component of the semiconductor device shown in FIG. 5.

In the conventional device shown in FIG. 6, since between the gate pad 50 and the gate electrode 2 is connected by the gate drawing line 65, after all, a wire length of the gate becomes long and the input inductance becomes large.

Then, an object of the present invention is to provide an FET having small input inductance, in view of the above-mentioned subject.

DISCLOSURE OF INVENTION

According to one aspect of the present invention for achieving the above-mentioned object, a semiconductor device including: a main substrate; a plurality of source finger electrodes disposed by predetermined direction on the main substrate; a plurality of drain finger electrodes placed a predetermined interval and disposed to the plurality of source finger electrodes, respectively; a plurality of gate finger electrodes disposed between the plurality of source finger electrodes and the plurality of drain finger electrodes; a plurality of source pads placed a predetermined interval and disposed at one side of the plurality of finger electrode array; a plurality of drain pads disposed between the plurality of source pads; a plurality of gate pads placed a predetermined interval and disposed at the another side of the plurality of finger electrode arrays; a source electrode wiring for connecting the source finger electrode of a prescribed number to the plurality of source pads; a drain electrode wiring for connecting the drain finger electrode of a prescribed number to the plurality of drain pads; and a gate electrode wiring for connecting the gate finger electrode of a prescribed number to the plurality of gate pads, is provided.

BEST MODE FOR CARRYING OUT THE INVENTION

Figure 1:
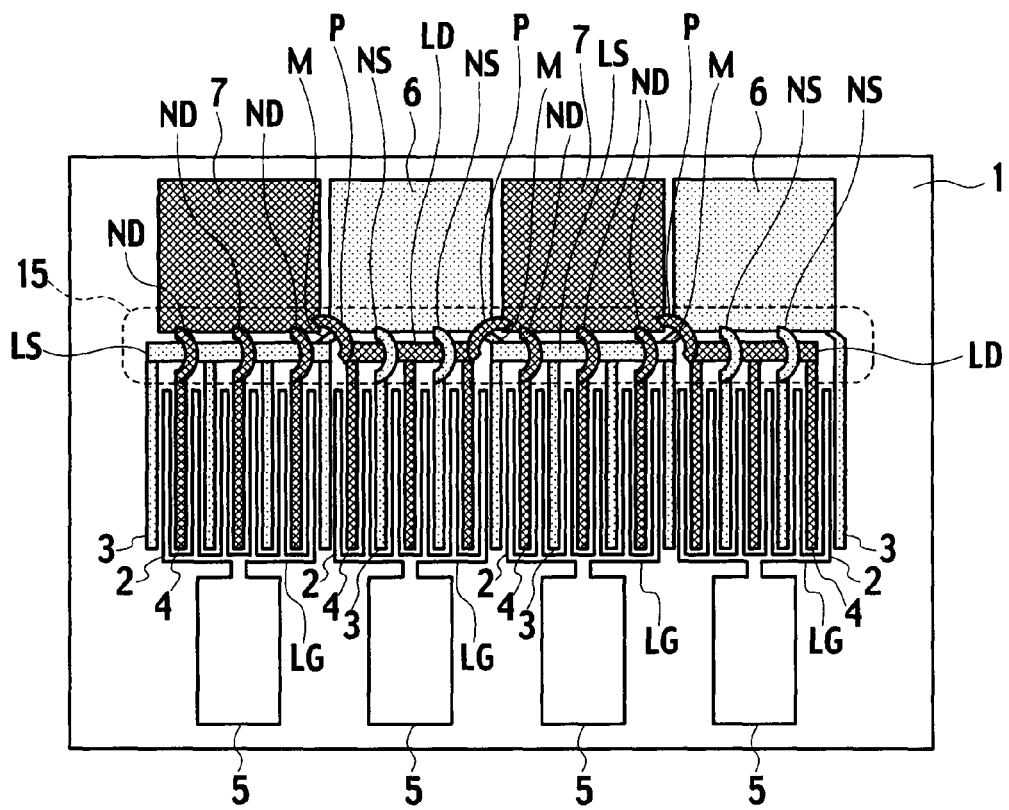
FIG. 1 It is a plan view showing an electrode structure of a semiconductor device according to a first embodiment of the present invention.

There will be described embodiments of the present invention, with reference to the drawings, where like members or elements are designated by like reference characters to eliminate redundancy, and some layers and their subsidiary regions are designated by the same reference characters for simplicity. Drawings are schematic, not actual, and may be inconsistent in between in scale, ratio, etc.

The embodiments to be described are embodiments of a technical concept or spirit of the present invention that is not limited to embodied specifics, and may be changed without departing from the spirit or scope of claims.

In the following explanation, a semiconductor element is formed on a substrate selected from a SiC substrate, a GaN/SiC substrate, an AlGaN/GaN/SiC substrate, a diamond substrate, and a sapphire substrate.

In particular, for example, when using the AlGaN/GaN/SiC substrate, the semiconductor element is composed as an HEMT (High Electron Mobility Transistor) using the high electron mobility in 2D EG (Two Dimensional Electron Gas) induced by the heterojunction interface. Moreover, for example, when using the GaN/SiC substrate, the semiconductor element can be composed as an MES (Metal semiconductor) FET using a Schottky Gate.

First Embodiment

FIG. 1 shows a plan view of an electrode structure of a semiconductor device according to a first embodiment of the present invention. Moreover, FIG. 2 shows a perspective view for explaining a configuration of a part of the semiconductor device according to the first embodiment of the present invention.

Figure 2:
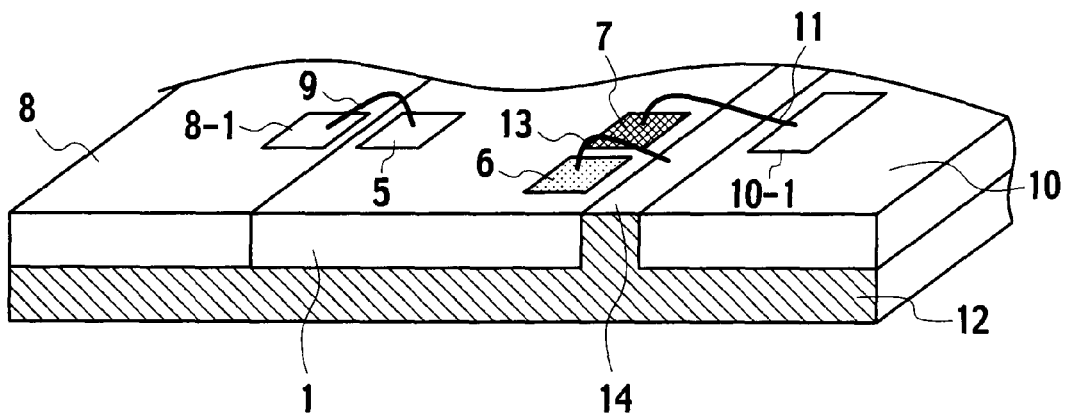
FIG. 2 It is a perspective view for explaining a configuration of a part of the semiconductor device according to the first embodiment of the present invention.

As shown in FIG. 1 and FIG. 2, the semiconductor device according to the first embodiment of the present invention includes: a main substrate 1; a plurality of source finger electrodes 3 disposed by determined direction on the main substrate 1; a plurality of drain finger electrodes 4 which are placed and are disposed a predetermined interval to a plurality of source finger electrodes 3, respectively; a plurality of gate finger electrodes 2 disposed between a plurality of source finger electrodes 3 and a plurality of drain finger electrodes 4; a plurality of source pads 6 which are placed and are disposed a predetermined interval at one side of a plurality of finger electrode array; a plurality of drain pads 7 disposed between a plurality of source pads 6; a plurality of gate pads 5 which are placed and are disposed a predetermined interval at the another side of a plurality of finger electrode arrays; source electrode wirings (source bus-line LS, source bridge-line NS and source bridge-line M), which connect the source finger electrode 3 of a prescribed number to a plurality of source pads 6; drain electrode wirings (drain bus-line LD, drain bridge-line ND, and drain bridge-line P), which connect the drain finger electrode 4 of a prescribed number to a plurality of drain pads 7; and gate electrode wirings (gate bus-lines) LG which connect the gate finger electrode 2 of a prescribed number to a plurality of gate pads 5.

Moreover, as shown in FIG. 1, the source bus-line LS, the source bridge-line NS and the source bridge-line M, and the drain bus-line LD, drain bridge-line ND, and drain bridge-line P have an overlay or an air bridge wiring part 15 over another side in one side.

Moreover, as shown in FIG. 1 and FIG. 2, the semiconductor device includes: a input side matching circuit substrate 8 by which adjacent disposition is performed to the array side of a plurality of gate pads 5 placed on the main substrate 1; a wire 9 for connecting an output terminal 8-1 and the gate pad 5 on the input side matching circuit substrate 8; an output side matching circuit substrate 10 which is placed a predetermined interval at the array side of a plurality of source pads 6 and a plurality of drain pads 7 which are placed on the main substrate 1; a wire 11 for connecting an input terminal 10-1 and the drain pad 7 on the output side matching circuit substrate 10; a ground plate 12 which is placed in common with a backside of the main substrate 1, the input side matching circuit substrate 8, and the output side matching circuit substrate 10, and a part has an exposed part 14 exposed to the surface of the main substrate 1 through between the main substrate 1 and the output side matching circuit substrate 10; and a wire 13 for connecting the source pad 6 to the exposed part 14.

The semiconductor device according to the first embodiment of the present invention is a multi-finger type FET, and as shown in FIG. 1, a plurality of source finger electrodes 3 and a plurality of drain finger electrodes 4 are disposed by turns on the main substrate 1. And, the one gate finger electrode 2 is placed between the arbitrary adjoining source finger electrode 3 and drain finger electrode 4 of a pair.

The rectangular source pad 6 and drain pad 7 are disposed by turns along with the finger electrode array at one side of these each finger electrode array side, for example, the upper side of FIG. 1. On the other hand, the rectangular gate pad 5 is disposed at another side of the finger electrode array, for example, the lower side of FIG. 1.

The arrangement relationship of each of these gate pads 5, the source pads 6 and the drain pads 7, and each of the gate finger electrodes 2, the source finger electrodes 3 and the drain finger electrodes 4 are as follows.

That is, the drain finger electrode 4 is also placed besides the source finger electrode 3 on the lower part of the source pad 6. Similarly, the source finger electrode 3 is also placed besides the drain finger electrode 4 on the lower part of the drain pad 7.

Connection between the source pad 6 and the source finger electrode 3 is performed as follows. That is, for example, the four source finger electrodes 3 disposed with the down side of the drain pad 7 within the limits of pad width in the direction of the finger electrode array are connected with those top ends in common through the source bus-line LS, and are connected to the source pads 6 of both sides of the drain pads 7 through the source electrode wirings M formed on the surface of the main substrate 1, in both of the right and left ends part of the source bus-line LS.

For example, the two source finger electrodes 3, disposed with the down side of the source pad 6 within the limits of pad width in the direction of the finger electrode array, are connected to the source pads 6 through the overlay source electrode wirings NS, respectively.

Next, connection between the drain pad 7 and the drain finger electrode 4 is performed as follows. That is, for example, three drain finger electrodes 4, disposed with the down side of the source pad 6 within the limits of pad width in the direction of the finger electrode array, are connected with those top ends in common through the drain bus-line LD extended and formed in the direction of the finger electrode array, and are connected to the drain pads 7 of both sides of the source pads 6 through the overlay drain bridge-line P, in both of the right and left ends part of the drain bus-line LD.

Moreover, for example, three drain finger electrodes 4 disposed with the down side of the drain pads 7 within the limits of the pad width in the direction of the finger electrode array are connected to the drain pads 7 through the overlay drain bridge-lines ND, respectively.

Furthermore, connection between the gate pad 5 and the gate finger electrode 2 is performed as follows. That is, the six continuous gate finger electrodes 2 are connected with those bottom ends in common through the gate bus-lines LG extended and formed in the direction of the finger electrode array, and are connected to the gate pads 5 in which the central part of the gate bus-lines LG is placed in the neighborhood.

Next, with reference to FIG. 2, connection with each of the gate pad 5, the source pad 6, the drain pad 7, the input side substrate 8, and the output side substrate 10 will be described.

As shown in FIG. 2, as for the input side substrate 8 and the output side substrate 10, the metal ground plates 12 are formed on those backs with the substrate 1. And, between the substrate 1 and the output side substrate 10, the convex exposed part 14 exposed to those surfaces is formed on the ground plate 12. This ground plate 12 functions as common earth potentials for the circuit formed on the main substrate 1, the input side substrate 8, and the output side substrate 10.

As shown in FIG. 2, the gate pad 5 is provided on the input side of the main substrate 1, and is connected to the input matching circuit (output terminal 8-1) formed on the input side of the substrate 8 through the wire 9.

The source pad 6 is connected to the exposed part 14 of the ground plate 12 through the wire 13. And, the drain pad 7 is connected to the output matching circuit (input terminal 10-1) formed on the output side of the substrate 10 through the wire 11, respectively.

Thus, in the semiconductor device according to the first embodiment of the present invention, it can provide the exposed part 14 of the ground plate 12 in the output side instead of the input side of the FET by placing the source pad 6 to the same side as the drain pad 7 in the substrate 1, and, as a result, the length of the wire 9 which connects the gate pad 5 and the circuit on the input side of the substrate 8 can be shortened.

In addition, as a result, since the wire 11 which connects the drain pad 7 and the output matching circuit (input terminal 10-1) formed on the output side of the substrate 10 is wired ranging over the exposed part 14 of the ground plate 12, its length becomes long and the output inductance of FET becomes large.

However, generally, since the output impedance of FET has a value of several times or more compared with input impedance, the influence of characteristics on the FET by increment of the output inductance is not serious compared with the input inductance.

Moreover, the semiconductor device according to the first embodiment, a part to which the wiring member as the drain bus-line LD, the drain bridge-line ND, and the drain bridge-line P for connecting the drain pad 7 and the drain finger electrode 4 intersects the wiring member as the source bus-line LS, the source bridge-line NS and the source bridge-line M for connecting the source pad 6 and the source finger electrode 3, i.e., the overlay or the air bridge wiring part 15 are placed near the source pad 6 and the drain pad 7.

On the other hand, the overlay between the gate bus-lines LG and the drain bus-line LD, the drain bridge-line ND, and the drain bridge-line P, or the overlay between the gate bus-lines LG and the source bus-line LS, the source bridge-line NS and the source bridge-line M does not occur.

Therefore, in the semiconductor device according to the first embodiment, the stray capacity resulting from the overlap between the gate bus-lines LG and the drain bus-line LD, the drain bridge-line ND, and the drain bridge-line P, or the stray capacity resulting from the overlap between the gate bus-lines LG and the source bus-line LS, the source bridge-line NS and the source bridge-line M does not occur.

According to the semiconductor device according to the first embodiment of the present invention, also in a semiconductor element with difficult formation of the via hole, such as GaN (gallium nitride) and SiC (silicon carbide), it can form the grounding electrode.

According to the first embodiment of the present invention, since the wire length which connects the gate pad 5 and the matching circuit for the input can be short, the semiconductor device of low input inductance can be provided.

Second Embodiment

Figure 3:
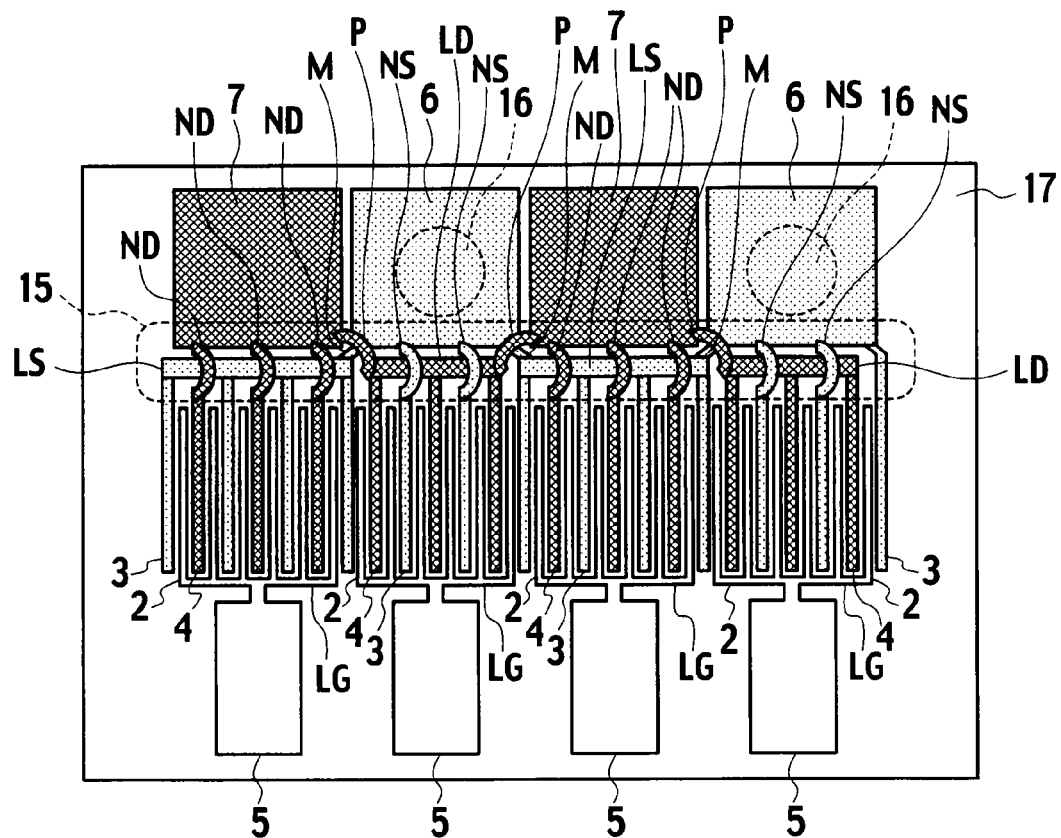
FIG. 3 It is a plan view showing an electrode structure of a semiconductor device according to a second embodiment of the present invention.

FIG. 3 shows a plan view showing an electrode structure of a semiconductor device according to a second embodiment of the present invention. Moreover, FIG. 4 shows a perspective view for explaining a configuration of a part of the semiconductor devices according to the second embodiment of the present invention.

Figure 4:
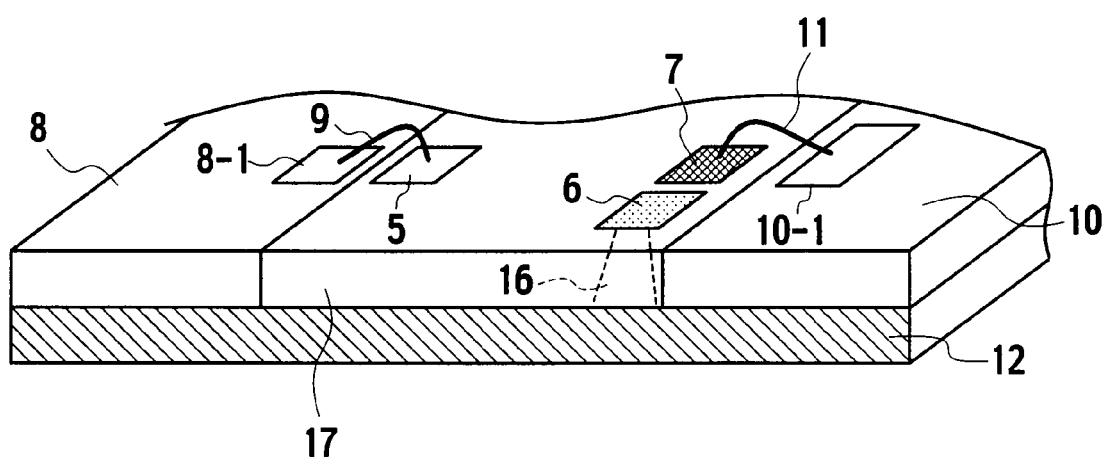
FIG. 4 It is a perspective view for explaining a configuration of a part of the semiconductor device according to the second embodiment of the present invention.

As shown in FIG. 3 and FIG. 4, the semiconductor device according to the first embodiment of the present invention includes: a main substrate 17; a plurality of source finger electrodes 3 disposed by determined direction on the main substrate 17; a plurality of drain finger electrodes 4 which are placed and are disposed a predetermined interval to a plurality of source finger electrodes 3, respectively; a plurality of gate finger electrodes 2 disposed between a plurality of source finger electrodes 3 and a plurality of drain finger electrodes 4; a plurality of source pads 6 which are placed and are disposed a predetermined interval at one side of a plurality of finger electrode array; a plurality of drain pads 7 disposed between a plurality of source pads 6; a plurality of gate pads 5 which are placed and are disposed a predetermined interval at the another side of a plurality of finger electrode arrays; source bus-line LS, source bridge-line NS and source bridge-line M which connect the source finger electrode 3 of a prescribed number to a plurality of source pads 6; drain bus-line LD, drain bridge-line ND, and drain bridge-line P which connect the drain finger electrode 4 of a prescribed number to a plurality of drain pads 7; and gate bus-lines LG which connect the gate finger electrode 2 of a prescribed number to a plurality of gate pads 5.

Moreover, as shown in FIG. 3, the source bus-line LS, the source bridge-line NS and the source bridge-line M and the drain bus-line LD, the drain bridge-line ND, and the drain bridge-line P have an overlay or an air bridge wiring part 15 over another side in one side.

Moreover, as shown in FIG. 3 and FIG. 4, the semiconductor device includes: an input side matching circuit substrate 8 by which adjacent disposition is performed to the array side of a plurality of gate pads 5 placed on the main substrate 17; a wire 9 which connects an output terminal 8-1 and the gate pad 5 on the input side matching circuit substrate 8; an output side matching circuit substrate 10 by which adjacent disposition is performed to the array side of a plurality of source pads 6 and a plurality of drain pads 7 which are placed on the main substrate 17; a wire 11 which connects an input terminal 10-1 and the drain pad 7 on the output side matching circuit substrate 10; a plurality of via holes 16 which pass through the main substrate 17 and are connected with a plurality of source pads 6, respectively; and a ground plate 12 which is placed common to a backside of the main substrate 17, the input side matching circuit substrate 8, and the output side matching circuit substrate 10, and is connected with a plurality of source pads 6 through a plurality of via holes 16.

In the semiconductor device according to the first above-mentioned embodiment, the source pad 6 is grounded by the exposed part 14 of the ground plate 12 through the wire 13 for bonding. In the semiconductor device according to the second embodiment of the present invention, as shown in FIG. 3 and FIG. 4, the source pad 6 is connected to the ground plate 12 and is grounded, through the via hole 16 formed in the main substrate 17 under the source pad 6. Other configurations are the same as that of FIG. 1 and FIG. 2.

Figure 5:
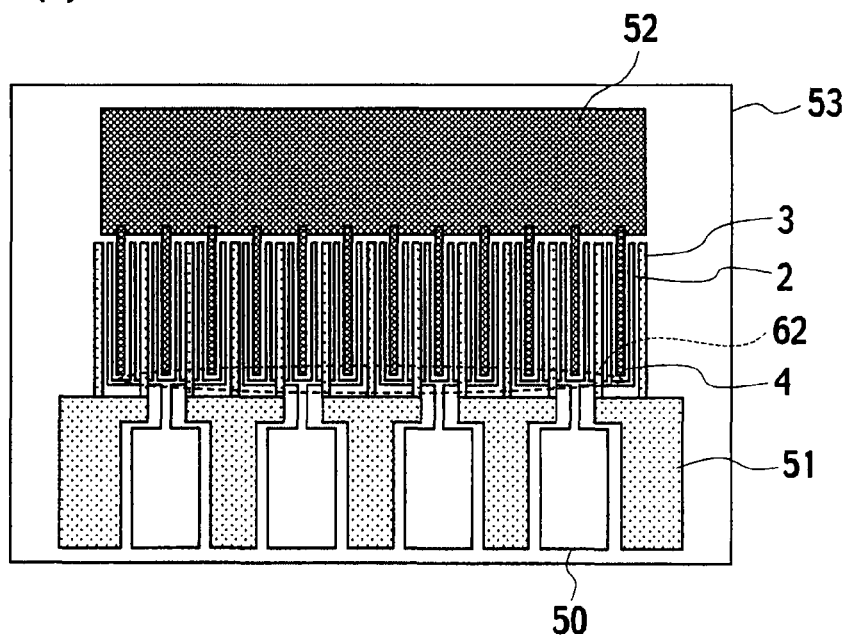
FIG. 5 It is a figure for explaining an electrode structure of a conventional semiconductor device.
Figure 5:
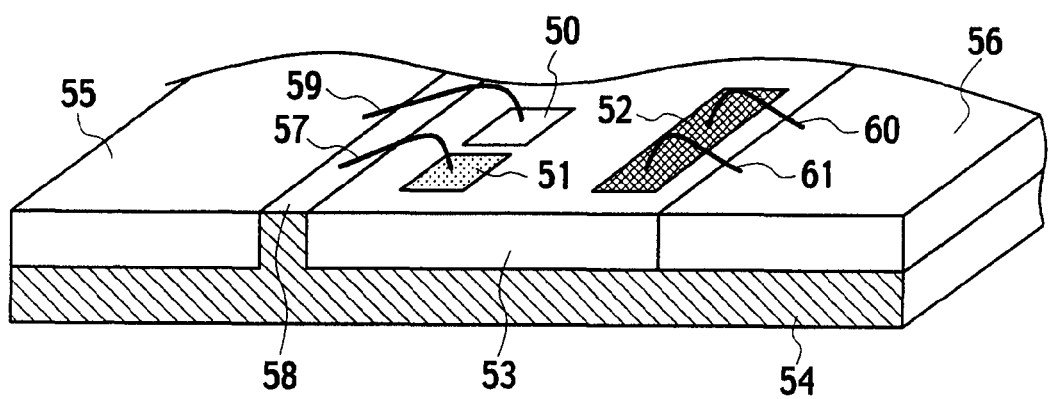
Figure 6:
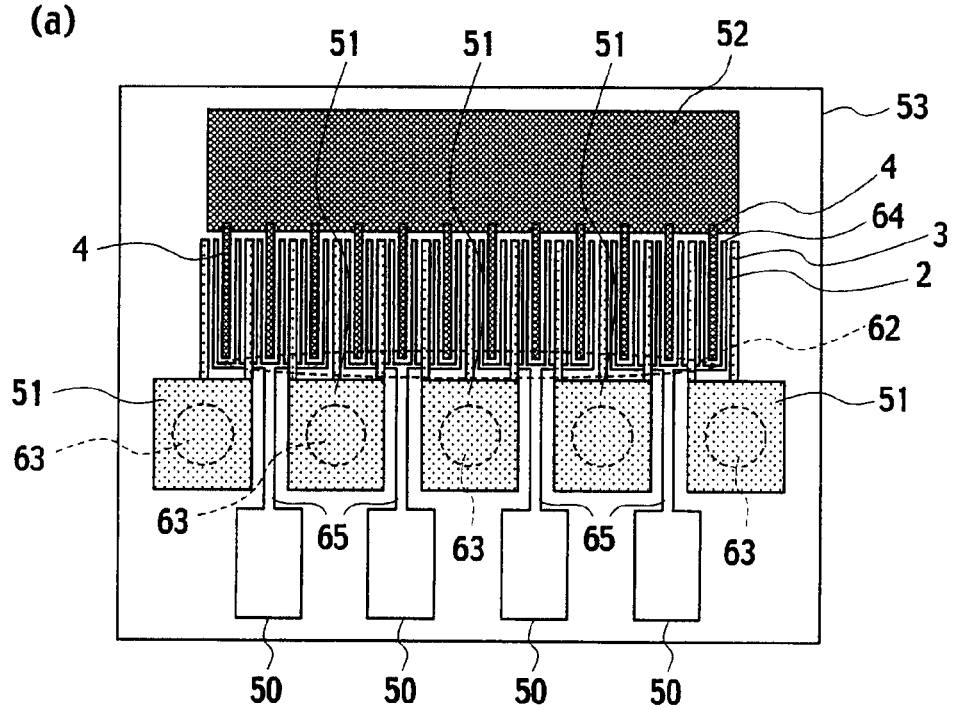
FIG. 6 It is a figure for explaining an electrode structure of another conventional semiconductor device.
Figure 6:
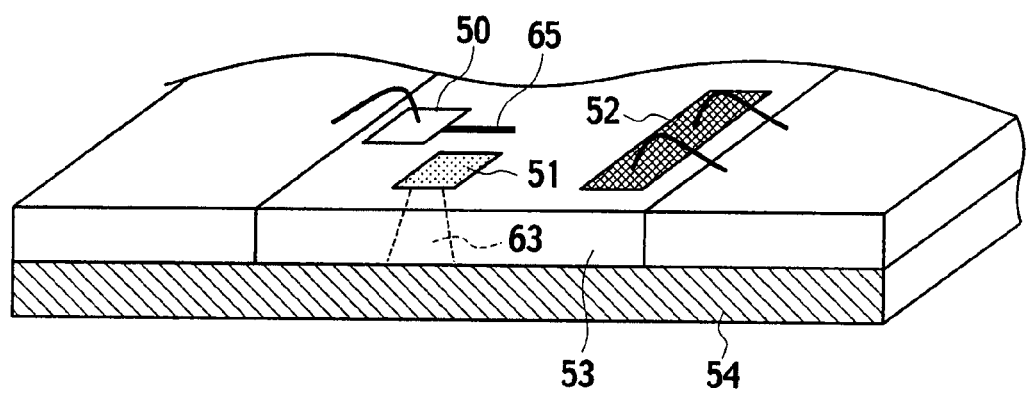

In the semiconductor device according to the second embodiment of the present invention, since the position of the source pad 6 is displaced to the position of the drain pad 52 in a conventional device which is shown in FIG. 5 and FIG. 6, and the via hole 16 is formed in the source pad 6, the wire length between the gate pad 5 and the gate finger electrode 2 can be shortened.

Moreover, since the overlay with other source electrodes 3 and drain electrode 4 does not occur in the gate electrode 2, and therefore the stray capacity of the gate finger electrode 2 can also be made small, the influence on the frequency characteristic of the FET can be made small.

According to the second embodiment of the present invention, since the wire length which connects the gate pad and the matching circuit for the input can be short, the semiconductor device of low input inductance can be provided.

Other Embodiments

The present invention has been described by the first to second embodiments and its modification, as a disclosure including associated description and drawings to be construed as illustrative, not restrictive. With the disclosure, artisan might easily think up alternative embodiments, embodiment examples, or application techniques.

In addition, the present invention is not limited to the above-mentioned embodiments as they are, and therefore shape can be taken by modifying components in an implementation phase in the scope which does not deviate from the gist. In the above-mentioned embodiment, on the substrate, the order of the source pad 6 and the drain pad 7 may be replaced, and in this case, the order of the source finger 3 and the drain finger 4 is also replaced. Various values, such as the length of the side of the main substrates 1 and 17, the length of each finger and the interval of arrangement, the length of the side of each pad and the interval of arrangement, the structure of the overlap of the wiring member in the overlay or the air bridge wiring part 15, and the diameter of the via hole 16, in the above-mentioned explanation, can be changed.

Moreover, various inventions can be formed with a proper combination of a plurality of components currently disclosed by the above-mentioned embodiment. For example, some components may be eliminated from all the components shown in the embodiments. Furthermore, the component covering a different embodiment may be combined suitably.

In the first to second embodiments, although the SiC substrate is mentioned as the main substrates 1 and 17 used for the semiconductor element, it is not limited to this. When using a satisfactory substrate of heat radiation characteristics, such as a GaN/SiC substrate, an AlGaN/GaN/SiC substrate, and a diamond substrate, it is possible to ground by formation of the via hole 16.

In the case of silicon or GaAs substrate, processing for formation of the via hole is easy, but it is also effective to apply also when processing for formation of via hole, such as a SiC substrate and a sapphire substrate, uses a difficult substrate.

Such being the case, the present invention covers a variety of embodiments, whether described or not. Therefore, the technical scope of the present invention is appointed only by the invention specific matter related appropriate scope of claims from the above-mentioned explanation.

The invention claimed is:

1. A semiconductor device comprising:
    a main substrate;
    a plurality of source finger electrodes disposed on the main substrate in a predetermined direction;
    a plurality of drain finger electrodes, the drain finger electrodes and the source finger electrodes being alternately arranged in the predetermined direction;
    a plurality of gate finger electrodes, respective ones of the gate finger electrodes being disposed between a respective source finger electrode and a respective drain finger electrode, in the predetermined direction;
    a plurality of source pads disposed at only an output side of an array of the finger electrodes;
    a plurality of drain pads disposed between the plurality of source pads;
    a plurality of gate pads disposed at only an input side of the array of the plurality of finger electrodes;
    a source electrode wiring for connecting a predetermined number of the source finger electrodes to the plurality of source pads;
    a drain electrode wiring for connecting a predetermined number of the drain finger electrodes to the plurality of drain pads; and
    a gate electrode wiring for connecting a predetermined number of the gate finger electrodes to the plurality of gate pads.

2. The semiconductor device according to claim 1, wherein the source electrode wiring has one of an overlay and air bridge configured to straddle the drain electrode wiring, and the drain electrode wiring has one of an overlay and an air bridge configured to straddle the source electrode wiring.

3. The semiconductor device according to claim 1, further comprising:
    an input side matching circuit substrate disposed adjoining an array side of the plurality of gate pads disposed on the main substrate;
    a first wire for connecting between an output terminal on the input side matching circuit substrate and the gate pad;
    an output side matching circuit substrate disposed at an array side of the plurality of source pads and the plurality of drain pads on the main substrate so as to leave predetermined space opposed to the array of the plurality of source pads and the plurality of drain pads;
    a second wire for connecting between an input terminal on the output side matching circuit substrate and the drain pad;
    a ground plate disposed on respective backsides of the main substrate, the input side matching circuit substrate and the output side matching circuit substrate, the ground plate having an exposed part exposed on the main substrate surface between the main substrate and the output side matching circuit substrate; and
    a third wire for connecting the source pad to the exposed part.

4. The semiconductor device according to claim 1, further comprising:
   an input side matching circuit substrate disposed adjoining to an array side of the plurality of gate pads disposed on the main substrate;
   a first wire for connecting between an output terminal on the input side matching circuit substrate and the gate pad;
   an output side matching circuit substrate disposed adjoining to an array side of the plurality of source pads and the plurality of drain pads disposed on the main substrate;
   a second wire for connecting between an input terminal on the output side matching circuit substrate and the drain pad;
   a plurality of via holes which pass through the main substrate and are connected with the plurality of source pads, respectively; and
   a ground plate disposed on respective backsides of the main substrate, the input side matching circuit substrate and the output side matching circuit substrate, and connected with the plurality of source pads through the plurality of via holes, respectively.

5. The semiconductor device according to claim 1, wherein the main substrate is a substrate selected from a group consisting of an SiC substrate, a GaN/SiC substrate, an AlGaN/GaN/SiC substrate, a diamond substrate, and a sapphire substrate.

* * * * *